United States Patent
Choi et al.

(10) Patent No.: US 11,038,546 B2
(45) Date of Patent: Jun. 15, 2021

(54) ELECTRONIC DEVICE INCLUDING A TEMPERATURE SENSOR CONNECTED TO A POWER AMPLIFIER AND A CONTROLLER TO CONTROL AN INPUT POWER BASED ON A TEMPERATURE OF THE POWER AMPLIFIER DETECTED BY THE TEMPERATURE SENSOR

(71) Applicant: SAMSUNG ELECTRONICS CO., LTD., Suwon-si (KR)

(72) Inventors: Dooseok Choi, Hwaseong-si (KR); Young Min Kim, Suwon-si (KR); Jei Young Lee, Yongin-si (KR); Dae Young Yoon, Yongin-si (KR); Sun Woo Lee, Suncheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/864,251

(22) Filed: May 1, 2020

(65) Prior Publication Data
US 2021/0067191 A1    Mar. 4, 2021

(30) Foreign Application Priority Data
Sep. 2, 2019   (KR) .......................... 10-2019-0108046

(51) Int. Cl.
*H04B 1/04*      (2006.01)
*H03F 1/30*      (2006.01)
(Continued)

(52) U.S. Cl.
CPC ................. *H04B 1/40* (2013.01); *H03F 3/19* (2013.01); *H03F 3/211* (2013.01); *H03F 3/245* (2013.01);
(Continued)

(58) Field of Classification Search
CPC .. H04B 1/04; H04B 17/10; H04B 2001/0408; H04B 2001/0416; H03F 1/30; H03F 1/32; H03F 1/34; H03F 1/52
See application file for complete search history.

(56) References Cited

U.S. PATENT DOCUMENTS 6,759,902 B2 * 7/2004 Kossor ................ H03G 3/3042
                                                        330/136
7,257,381 B2   8/2007 Ammar
(Continued)

FOREIGN PATENT DOCUMENTS

KR   10-2019-0026449   3/2019

*Primary Examiner* — Blane J Jackson
(74) *Attorney, Agent, or Firm* — F. Chau & Associates, LLC

(57) ABSTRACT

An electronic device including: a modem configured to process a baseband signal; an intermediate frequency (IF) transceiver configured to convert the baseband signal provided from the modem into an IF band signal; and a radio frequency (RF) transceiver configured to convert the IF band signal provided from the IF transceiver into an RF band signal, wherein the RF transceiver includes a power amplifier configured to amplify the RF band signal, and a temperature sensor unit to detect a temperature of the power amplifier, and wherein the modem includes a controller configured to control an input power inputted to the RF transceiver based on the temperature of the power amplifier detected by the temperature sensor unit.

17 Claims, 18 Drawing Sheets

(51) Int. Cl.
  *H03F 1/52* (2006.01)
  *H04B 1/40* (2015.01)
  *H03F 3/19* (2006.01)
  *H03F 3/21* (2006.01)
  *H03F 3/24* (2006.01)

(52) U.S. Cl.
  CPC .. *H03F 2200/105* (2013.01); *H03F 2200/451* (2013.01); *H03F 2200/468* (2013.01)

(56) References Cited

U.S. PATENT DOCUMENTS

| | | |
|---|---|---|
| 7,565,124 B2 | 7/2009 | Lee et al. |
| 7,684,772 B2 | 3/2010 | Lee et al. |
| 8,693,969 B2 | 4/2014 | Bickerstaff et al. |
| 9,020,011 B1* | 4/2015 | Hiebert ............... H04B 7/0837 375/219 |
| 9,071,217 B1 | 6/2015 | Saito et al. |
| 9,488,717 B1 | 11/2016 | Kavaler |
| 9,503,107 B1 | 11/2016 | Kim et al. |
| 9,673,846 B2 | 6/2017 | Hageman et al. |
| 10,027,287 B1 | 7/2018 | Ichitsubo et al. |
| 2006/0012427 A1* | 1/2006 | Nezami ............... H03F 1/3247 330/149 |
| 2006/0199547 A1* | 9/2006 | Song ................... H04W 52/288 455/67.11 |
| 2007/0264942 A1 | 11/2007 | Wu |
| 2010/0227596 A1* | 9/2010 | Suresh ................ H04M 3/493 455/414.2 |
| 2010/0278538 A1 | 11/2010 | Guidotti et al. |
| 2017/0346468 A1 | 11/2017 | Okazaki et al. |

\* cited by examiner

FIG. 7

| $T_{PA}$ | Gain drop [dB] |
|---|---|
| 70 | 0.5 |
| 75 | 1 |
| 80 | 1.5 |
| 85 | 2 |
| 90 | 2.5 |
| 95 | 3 |
| 100 | 3.5 |
| 105 | 4 |
| 110 | 4.5 |

ELECTRONIC DEVICE INCLUDING A TEMPERATURE SENSOR CONNECTED TO A POWER AMPLIFIER AND A CONTROLLER TO CONTROL AN INPUT POWER BASED ON A TEMPERATURE OF THE POWER AMPLIFIER DETECTED BY THE TEMPERATURE SENSOR

CROSS-REFERENCE TO RELATED APPLICATION

This application claims priority under 35 U.S.C. § 119 to Korean Patent Application No. 10-2019-0108046 filed on Sep. 2, 2019 in the Korean Intellectual Property Office, the disclosure of which is incorporated by reference herein in its entirety.

TECHNICAL FIELD

The present inventive concept relates to an electronic device.

DESCRIPTION OF THE RELATED ART

To meet an increasing demand for wireless data traffic after commercialization of a fourth generation (4G) communication system, efforts have been made to develop a fifth generation (5G) communication system or a pre-5G communication system. The 5G communication system or pre-5G communication system may be referred to as a beyond 4G network communication system or post long term evolution (LTE) system. To achieve a high data transmission rate, the 5G communication system is implemented in a super high frequency millimeter wave (mmWave) band (for example, 60 GHz band).

In the super high frequency band, a high channel loss may occur due to frequency characteristics. Therefore, a radio frequency integrated circuit (RFIC) generating high output power is employed to secure a stable communication distance, and an antenna having a high gain is additionally employed to compensate for the high output power of the RFIC.

In a high gain antenna, a beam-forming technique is employed to secure a wide communication area because a beam having a physically narrow width is formed. In addition, a plurality of phase shifters and transceivers are provided in the RFIC to drive the antenna. In this case, heat generated by using a plurality of power amplifiers in the high frequency band may impact the performance of the 5G communication system.

SUMMARY

According to an exemplary embodiment of the present inventive concept, there is provided an electronic device comprising: a modem configured to process a baseband signal; an intermediate frequency (IF) transceiver configured to convert the baseband signal provided from the modem into an IF band signal; and a radio frequency (RF) transceiver configured to convert the IF band signal provided from the IF transceiver into an RF band signal, wherein the RF transceiver includes a power amplifier configured to amplify the RF band signal, and a temperature sensor unit to detect a temperature of the power amplifier, and wherein the modem includes a controller configured to control an input power inputted to the RF transceiver based on the temperature of the power amplifier detected by the temperature sensor unit.

According to an exemplary embodiment of the present inventive concept, there is provided an electronic device comprising: a modem configured to process a baseband signal; an IF transceiver configured to convert the baseband signal provided from the modem into an IF band signal; and an RF transceiver configured to convert the IF band signal provided from the IF transceiver into an RF band signal, wherein the RF transceiver includes a power amplifier configured to amplify the RF band signal, and a power detector to detect an output power of the amplified RF band signal, and wherein the modem includes a controller configured to control an input power inputted to the RF transceiver based on the output power of the RF band signal detected by the power detector.

According to an exemplary embodiment of the present inventive concept, there is provided an electronic device comprising: a modem configured to process a baseband signal; an IF transceiver configured to up-convert the baseband signal outputted from the modem and output an IF band signal; and an RF transceiver configured to up-convert the IF band signal outputted from the IF transceiver and output an RF band signal, wherein the RF transceiver includes a power amplifier configured to amplify the RF band signal, a temperature sensor unit connected to the power amplifier to detect a temperature of the power amplifier, and a power detector connected to the power amplifier to detect an output power of the amplified RF band signal, and wherein the modem includes a controller configured to control an input power inputted to the RF transceiver based on the temperature of the power amplifier detected by the temperature sensor unit, or the output power detected by the power detector, and a memory which stores a look-up table including temperatures of the power amplifier and gain drops of the RF transceiver respectively corresponding to the temperatures of the power amplifier.

BRIEF DESCRIPTION OF THE DRAWINGS

The above and other features of the present inventive concept will become more apparent by describing in detail exemplary embodiments thereof with reference to the attached drawings, in which:

FIG. 7 illustrates a look-up table included in a memory of an RF transceiver of an electronic device according to exemplary embodiments of the present inventive concept.

DETAILED DESCRIPTION OF THE EMBODIMENTS

Figure 1:
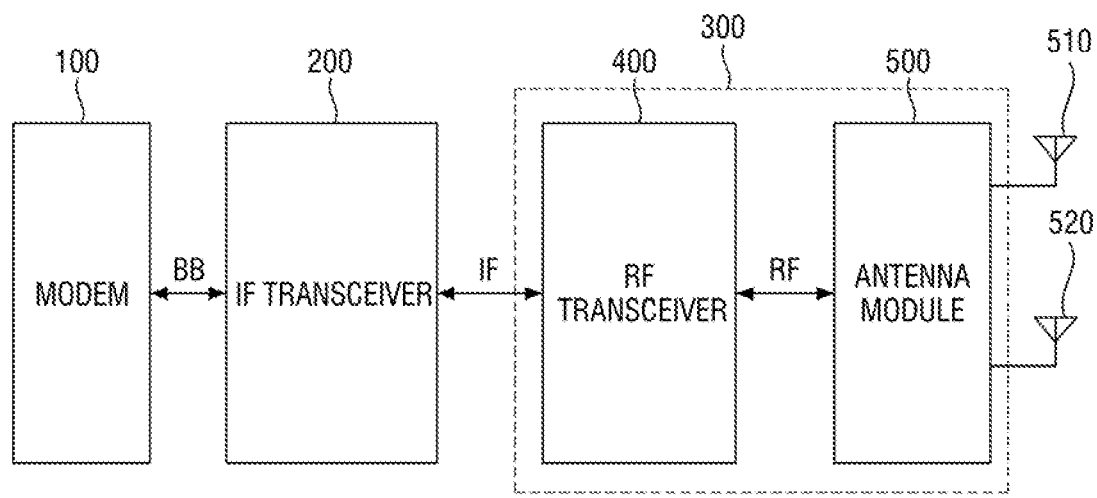
FIG. 1 is a system diagram of an electronic device according to exemplary embodiments of the present inventive concept.

FIG. 1 is a system diagram of an electronic device according to exemplary embodiments of the present inventive concept.

Referring to FIG. 1, an electronic device according to exemplary embodiments of the present inventive concept may include a modem 100, an intermediate frequency (IF) transceiver 200, and a radio frequency (RF) module 300.

The modem 100 may process a baseband signal. The IF transceiver 200 may convert a baseband signal BB received from the modem 100 into an IF band signal IF.

The RF module 300 may include an RF transceiver 400 and an antenna module 500.

The RF transceiver 400 may convert the IF band signal IF received from the IF transceiver 200 into an RF band signal RF.

The antenna module 500 may be connected to the RF transceiver 400 to receive or transmit the RF band signal RF. The antenna module 500 may include a plurality of antennas 510 and 520. Although two antennas 510 and 520 are illustrated in FIG. 1, the present inventive concept is not limited thereto and the electronic device may include more than two antennas. The electronic device may transmit and/or receive signals of a super high frequency millimeter wave (mmWave) band through the antennas 510 and 520.

Figure 2:
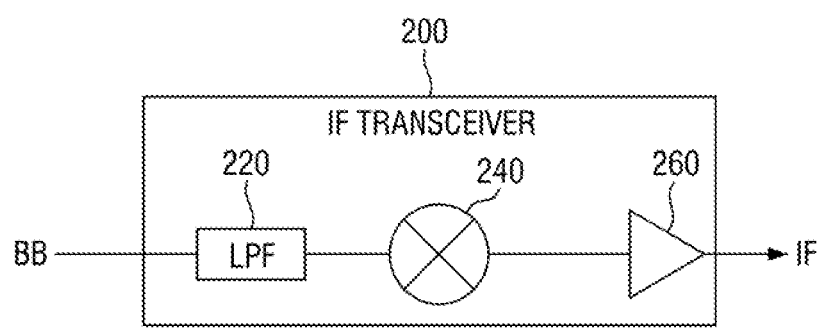
FIG. 2 is a block diagram of an intermediate frequency (IF) transceiver of the electronic device of FIG. 1.

FIG. 2 is a block diagram of an IF transceiver of the electronic device of FIG. 1.

Referring to FIG. 2, the IF transceiver 200 may include a low pass filter (LPF) 220, a mixer 240, and a power amplifier 260.

The low pass filter 220 may filter the frequency of the baseband signal BB provided from the modem 100. The mixer 240 may up-convert the frequency filtered by the low pass filter 220 into an IF band signal. The power amplifier 260 may output the amplified IF band signal IF.

Figure 3:
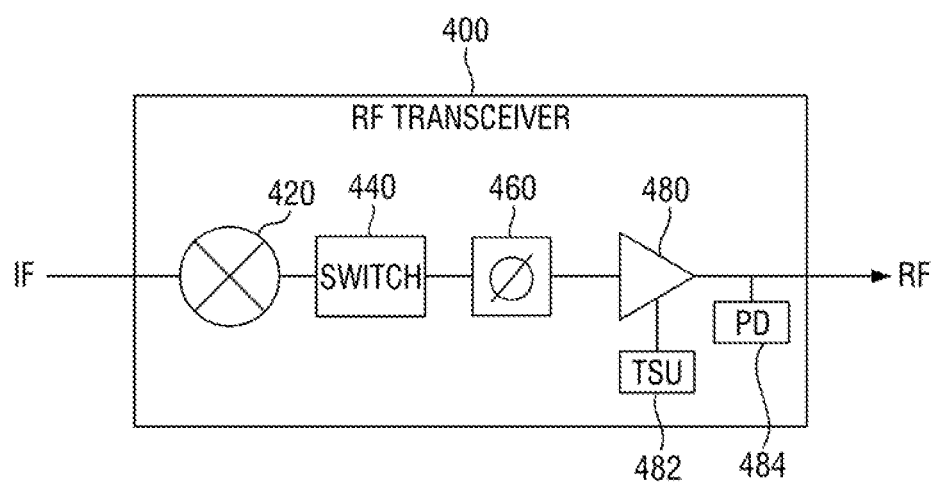
FIG. 3 is a block diagram of a radio frequency (RF) transceiver of the electronic device of FIG. 1.

FIG. 3 is a block diagram of an RF transceiver of the electronic device of FIG. 1.

Referring to FIG. 3, the RF transceiver 400 may include a mixer 420, a switch 440, a phase shifter 460, and a power amplifier 480.

The mixer 420 may up-convert the IF band signal IF to an RF band signal. The transmission/reception mode of the electronic device may be selected according to the switch 440. The phase shifter 460 may convert a phase of the RF band signal output from the mixer 420 into a set phase. The power amplifier 480 may amplify the RF band signal received from the phase shifter 460 and output the amplified RF band signal RF.

A temperature sensor unit 482 and a power detector 484 may be connected to the power amplifier 480. These components will be described with reference to FIG. 4.

Figure 4:
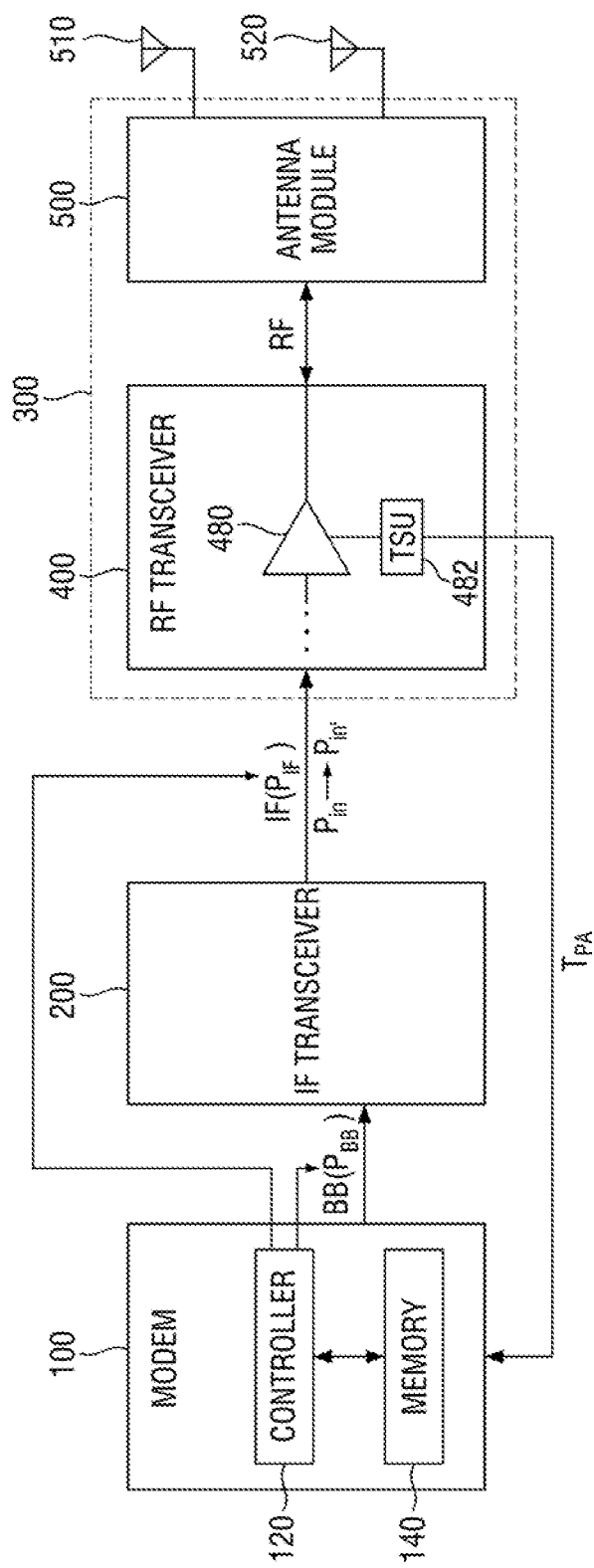
FIG. 4 is a block diagram of an electronic device according to exemplary embodiments of the present inventive concept.

FIG. 4 is a block diagram of an electronic device according to exemplary embodiments of the present inventive concept.

Referring to FIG. 4, the RF transceiver 400 may include the power amplifier 480 and the temperature sensor unit 482. For simplicity of description, although only the power amplifier 480 is illustrated in the RF transceiver 400 of FIG. 4, it is to be understood that the RF transceiver 400 of FIG. 3 may include the same configuration as the RF transceiver 400 of FIG. 3.

The temperature sensor unit 482 may be connected to the power amplifier 480. The temperature sensor unit 482 may detect the temperature of the power amplifier 480. A temperature $T_{PA}$ of the power amplifier 480 detected by the temperature sensor unit 482 may be provided to a controller 120 of the modem 100. The temperature sensor unit 482 may include circuitry to sense centigrade temperature.

The modem 100 may include the controller 120 and a memory 140.

The memory 140 may store a look-up table including the temperature of the power amplifier 480 and again drop of the RF transceiver 400 corresponding to the temperature of the power amplifier 480. In other words, the amount of gain that is reduced according to a particular temperature is stored in the memory 140. Hereinafter, a description of these components will be given with reference to FIGS. 5 to 7.

The controller 120 may read again drop of the RF transceiver 400 corresponding to the temperature of the power amplifier 480 detected by the temperature sensor unit 482 from the look-up table stored in the memory 140. The controller 120 may control input power $P_{in}$ of the signal inputted to the RF transceiver 400 according to the gain drop of the RF transceiver 400.

The controller 120 according to exemplary embodiments of the present inventive concept may control power $P_{IF}$ of the IF band signal IF according, for example, to the gain drop of the RF transceiver 400. Alternatively, the controller 120 according to other exemplary embodiments of the present inventive concept may control power $P_{BB}$ of the baseband signal BB according, for example, to the gain drop of the RF transceiver 400. Hereinafter, a description of these control functions will be given with reference to FIGS. 5 to 8.

Figure 5:
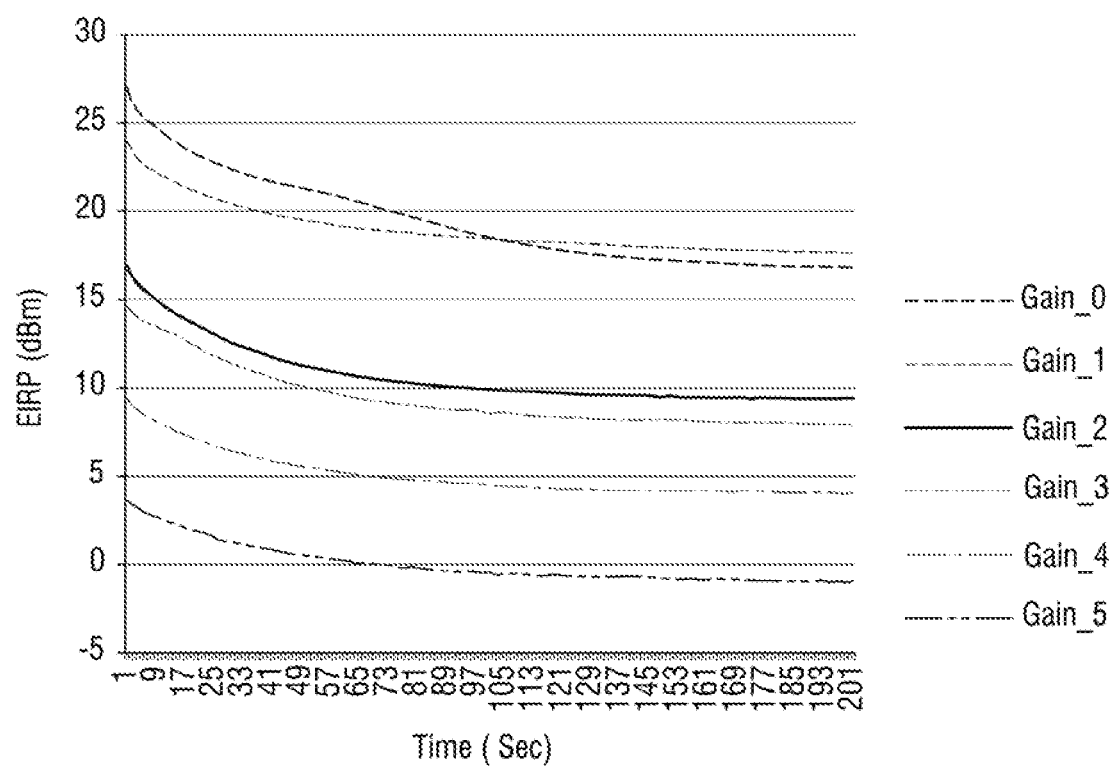
FIG. 5 is a graph illustrating effective isotropic radiated power (EIRP) of an electronic device according to a gain value of an RF transceiver.

FIG. 5 is a graph illustrating effective isotropic radiated power (EIRP) of an electronic device according to a gain value of an RF transceiver.

In FIG. 5, an X axis represents time and a Y axis represents effective isotropic radiated power (EIRP). Effective isotropic radiated power (EIRP) may refer to power radiated into the air through a plurality of antennas.

A gain value (Gain) may refer to a gain value of an RF transceiver. A gain value Gain_0 of the RF transceiver may refer to a maximum gain value of the RF transceiver, and a gain value Gain_5 of the RF transceiver may refer to a minimum gain value of the RF transceiver. The RF transceiver may have a smaller gain value as it goes from the gain value Gain_0 to the gain value Gain_5.

Referring to FIG. 5, as the time increases, the effective isotropic radiated power (EIRP) of the electronic device may decrease. Further, as the gain value (Gain) of the RF transceiver increases, the effective isotropic radiated power (EIRP) of the electronic device may decrease more significantly as the time increases. In other words, a higher gain value may drop more than a lower gain value over time.

In wireless communication in the mmWave band, an antenna with a high gain and an RF transceiver generating high output power are used to ensure a sufficient communication distance. In other words, since the mmWave band wireless communication uses an RF transceiver that generates high output power, the effective isotropic radiated power (EIRP) of the electronic device may decrease significantly over time.

Figure 6:
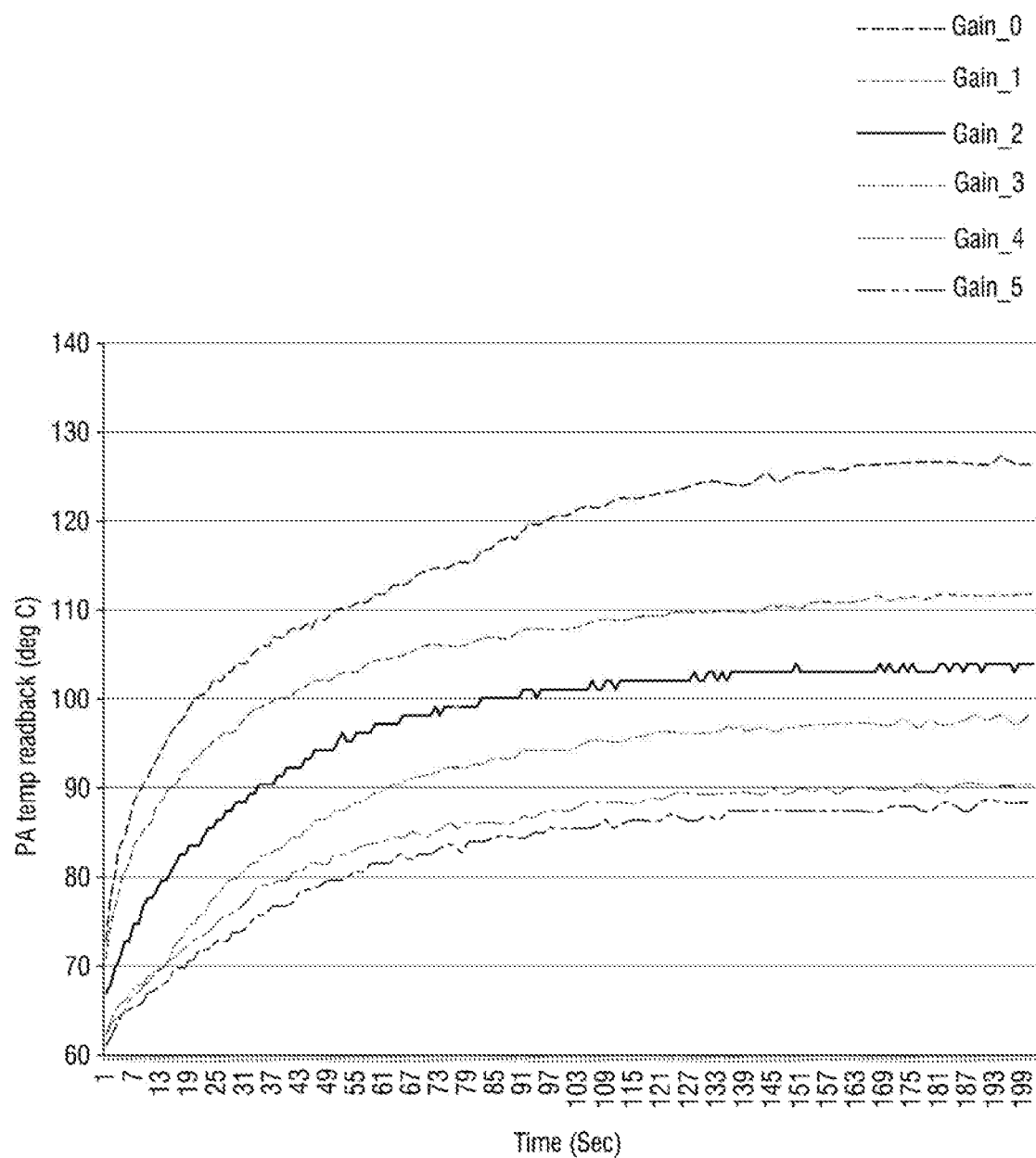
FIG. 6 is a graph illustrating a temperature of a power amplifier included in an RF transceiver according to a gain value of the RF transceiver of FIG. 5.

FIG. 6 is a graph illustrating a temperature of a power amplifier included in an RF transceiver according to a gain value of the RF transceiver of FIG. 5.

In FIG. 6, an X axis represents time and a Y axis represents the temperature (PA temp readback) of the power amplifier included in the RF transceiver. The gain values Gain_0 to Gain_5 of the RF transceiver are the same as the gain values Gain_0 to Gain_5 of the RF transceiver of FIG. 5.

Referring to FIG. 6, as the time increases, the temperature (PA temp readback) may increase. Further, as the gain value (Gain) of the RF transceiver increases, the temperature (PA temp readback) of the power amplifier may increase more significantly as the time increases.

Referring to FIGS. 5 and 6, in the electronic device, as the gain value (Gain) of the RF transceiver increases, the temperature (PA temp readback) of the power amplifier included in the RF transceiver increases significantly over time. Accordingly, the effective isotropic radiated power (EIRP) of the electronic device can be greatly reduced. In other words, the power amplifier included in the RF transceiver may have a large temperature change in the transmission and reception mode of the electronic device. In addition, the effective isotropic radiated power (EIRP) of the electronic device may be sensitive to the temperature (PA temp readback) of the power amplifier included in the RF transceiver.

Therefore, referring to FIG. 4, the electronic device according to exemplary embodiments of the present inventive concept detects the temperature $T_{PA}$ of the power amplifier 480 from the temperature sensor unit 482 connected to the RF transceiver 400, thereby controlling the effective isotropic radiated power (EIRP) of the electronic device. In addition, since the electronic device according to exemplary embodiments of the present inventive concept directly detects the temperature $T_{PA}$ of the power amplifier 480 and controls the effective isotropic radiated power (EIRP) of the electronic device, precise control is possible.

FIG. 7 illustrates a look-up table included in a memory of an RF transceiver of an electronic device according to exemplary embodiments of the present inventive concept.

Referring to FIGS. 5 and 6, the gain drop of the RF transceiver can be seen as the temperature (PA temp read-back) of the power amplifier included in the RF transceiver increases. Accordingly, the look-up table may include, for example, the temperature $T_{PA}$ of the power amplifier and a gain drop of the RF transceiver corresponding to the temperature of the power amplifier, as shown in FIG. 7. For example, at a temperature of 70 C the gain drop may be 0.5 dB and at a temperature of 110 C the gain drop may be 4.5 dB.

Figure 8:
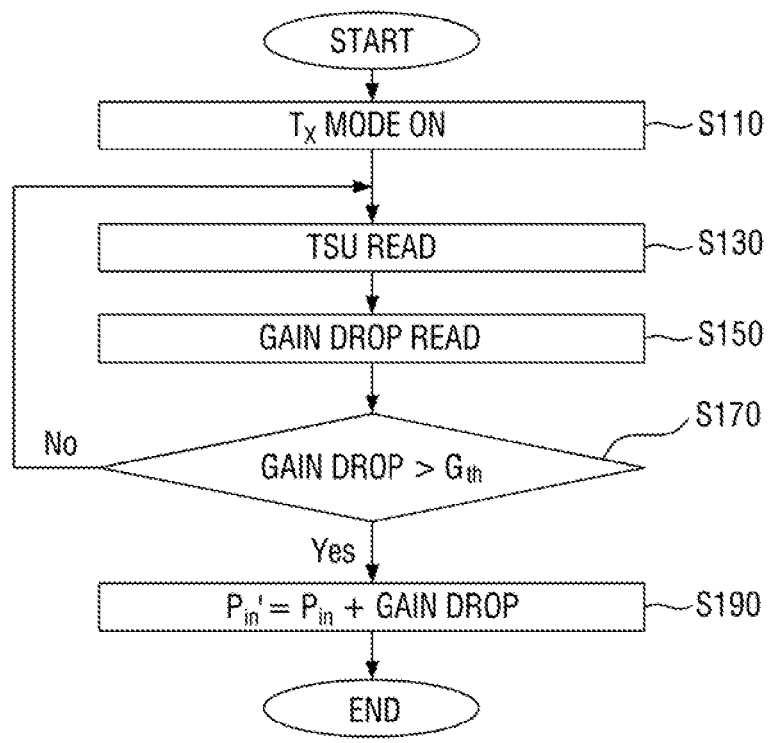
FIG. 8 is a flowchart illustrating an operation of an electronic device according to exemplary embodiments of the present inventive concept.

FIG. 8 is a flowchart illustrating an operation of an electronic device according to exemplary embodiments of the present inventive concept.

Referring to FIGS. 4, 7 and 8, an electronic device according to exemplary embodiments of the present inventive concept may be operated in a transmission mode ($T_X$ mode) (operation S110).

When the transmission mode is executed, the temperature sensor unit 482 connected to the power amplifier 480 may detect the temperature of the power amplifier 480 (operation S130). The temperature of the power amplifier 480 detected by the temperature sensor unit 482 may be provided to the controller 120 of the modem 100. For example, the temperature sensor unit 482 may provide the temperature $T_{PA}$ signal to the modem 100.

Then, the controller 120 may read the gain drop of the RF transceiver 400 corresponding to the temperature $T_{PA}$ of the power amplifier 480 detected by the temperature sensor unit 482 from the look-up table stored in the memory 140 (operation S150). In other words, the controller 120 may identify the gain drop corresponding to the temperature $T_{PA}$ signal in the look-up table.

Then, the controller 120 may determine whether the gain drop of the RF transceiver 400 is greater than a gain set value $G_{th}$ (operation S170). The gain set value $G_{th}$ may be set differently according to the electronic device. The gain set value $G_{th}$ may be a predetermined threshold. The gain set value $G_{th}$ may be, for example, 0.5 dB, but is not limited thereto.

Then, if it is determined that the gain drop of the RF transceiver 400 is greater than the gain set value $G_{th}$, the controller 120 may increase the input power $P_{in}$ inputted to the RF transceiver 400 (to $P_{in}'$) by a gain drop of the RF transceiver 400 (operation S190). The controller 120 may input, to the RF transceiver 400, for example, the input power $P_{in}'$ obtained by adding the gain drop of the RF transceiver 400 to the input power $P_{in}$ inputted to the RF transceiver 400.

For example, the controller 120 may increase the power $P_{BB}$ of the baseband signal BB to increase the input power $P_{in}$ inputted to the RF transceiver 400. Alternatively, the controller 120 may increase the power $P_{IF}$ of the IF band signal IF, for example, to increase the input power $P_{in}$ inputted to the RF transceiver 400.

In operation S170, when the controller 120 determines that the gain drop of the RF transceiver 400 is smaller than the gain set value $G_{th}$, the electronic device may return to operation S130.

The electronic device according to exemplary embodiments of the present inventive concept may compensate for a decrease in gain of the RF transceiver 400 according to a decrease in temperature of the power amplifier 480 with respect to the input power $P_{in}$ inputted to the RF transceiver 400. Therefore, the electronic device according to exemplary embodiments of the present inventive concept may improve or increase the effective isotropic radiated power (EIRP) according to the transmission mode of the electronic device. In addition, since the electronic device according to exemplary embodiments of the present inventive concept detects the temperature of the temperature-sensitive power amplifier 480 using the temperature sensor unit 482 directly connected to the power amplifier 480, precise control of the input power $P_{in}$ is possible.

If it is determined that the gain drop of the power amplifier 480 is greater than a power set value $P_{th}$, the controller 120 may increase the power $P_{BB}$ of the baseband signal BB or the power $P_{IF}$ of the IF band signal IF. Therefore, the controller 120 may control the input power $P_{in}$ of the signal provided to the RF transceiver 400, and control the power of the signal radiated through the antenna module 500 and the plurality of antennas 510 and 520.

Figure 9:
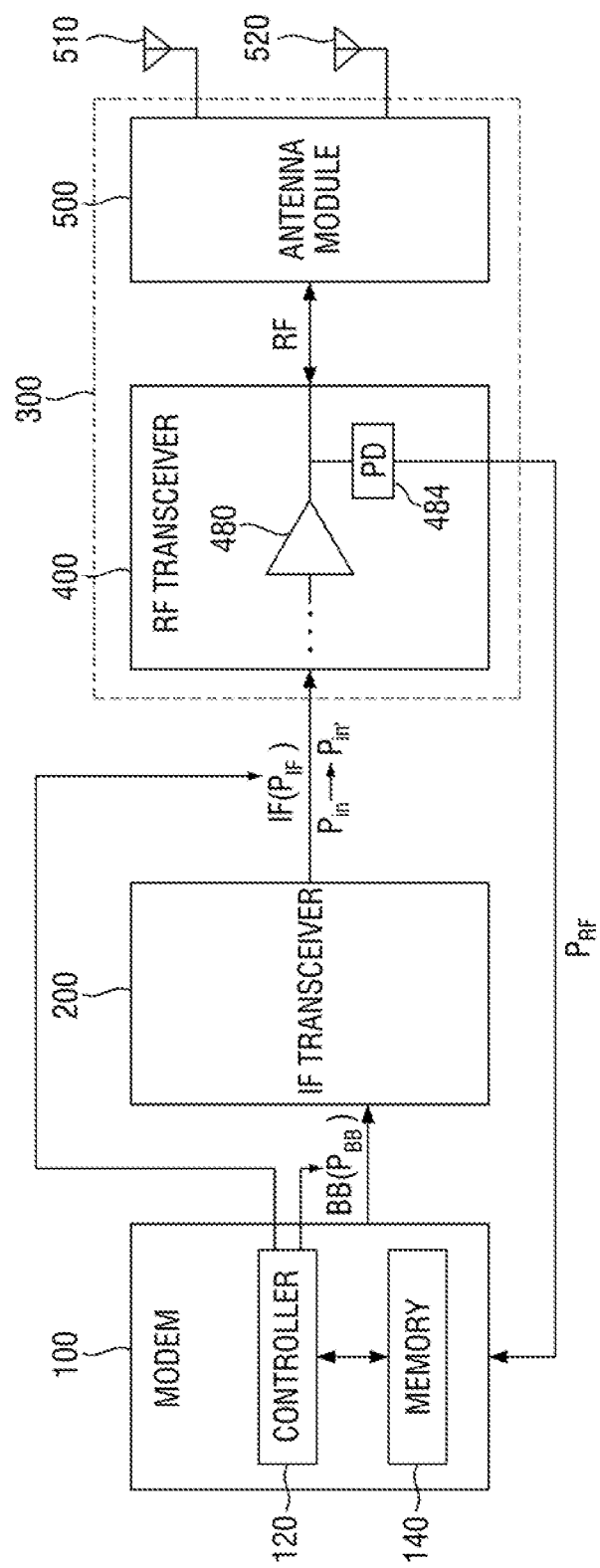
FIG. 9 is a block diagram of an electronic device according to other exemplary embodiments of the present inventive concept.

FIG. 9 is a block diagram of an electronic device according to other exemplary embodiments of the present inventive concept.

Referring to FIG. 9, the RF transceiver 400 may include the power amplifier 480 and the power detector 484.

The power detector 484 may be connected to an output terminal of the power amplifier 480 to detect the output power $P_{RF}$ of the RF band signal amplified by the power amplifier 480. The output power $P_{RF}$ detected by the power detector 484 may be provided to the controller 120. The power detector 484 may include circuitry for detecting the output power $P_{RF}$ of the RF band signal amplified by the power amplifier 480. For example, the power detector 484 may be an RF power detector.

The controller 120 may control the input power $P_{in}$ of the signal provided to the RF transceiver 400 based on the output power $P_{RF}$ detected by the power detector 484.

For example, the controller 120 may control the input power $P_{in}$ of the signal provided to the RF transceiver 400 by adjusting the baseband signal BB provided to the IF transceiver 200. Alternatively, for example, the controller 120 may control the input power $P_{in}$ of the signal provided to the RF transceiver 400 by adjusting the IF band signal IF provided to the RF transceiver 400. Hereinafter, a description of these functions will be given with reference to FIGS. 10 to 11.

Figure 10:
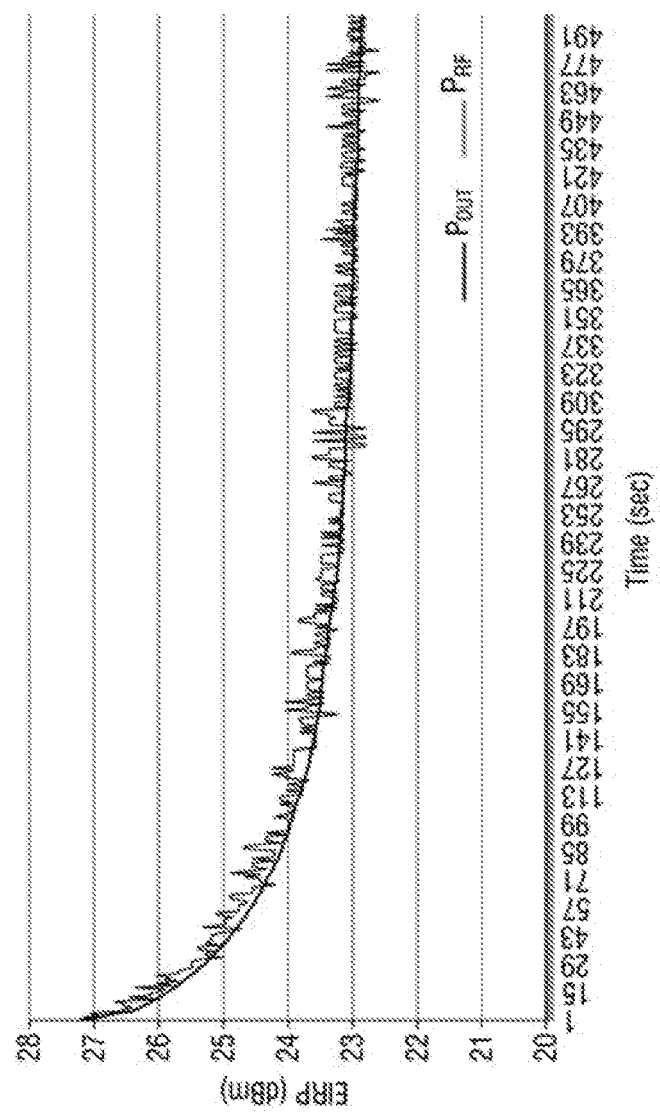
FIG. 10 is a graph illustrating output power detected by a power detector connected to a power amplifier and an EIRP value radiated from an actual antenna module.

FIG. 10 is a graph illustrating output power detected by a power detector connected to a power amplifier and an EIRP value radiated from an actual antenna module.

Referring to FIG. 10, the output power $P_{RF}$ of the RF band signal amplified by the power amplifier 480 detected by the power detector 484 is similar to the EIRP ($P_{OUT}$) value radiated from the actual antenna module. In other words, it is possible to predict an increase or decrease of the EIRP radiated from the actual antenna module based on the output power detected by the power detector.

Therefore, the increase or decrease of the output power of the electronic device may be determined based on the output power $P_{RF}$ detected by the power detector 484.

Figure 11:
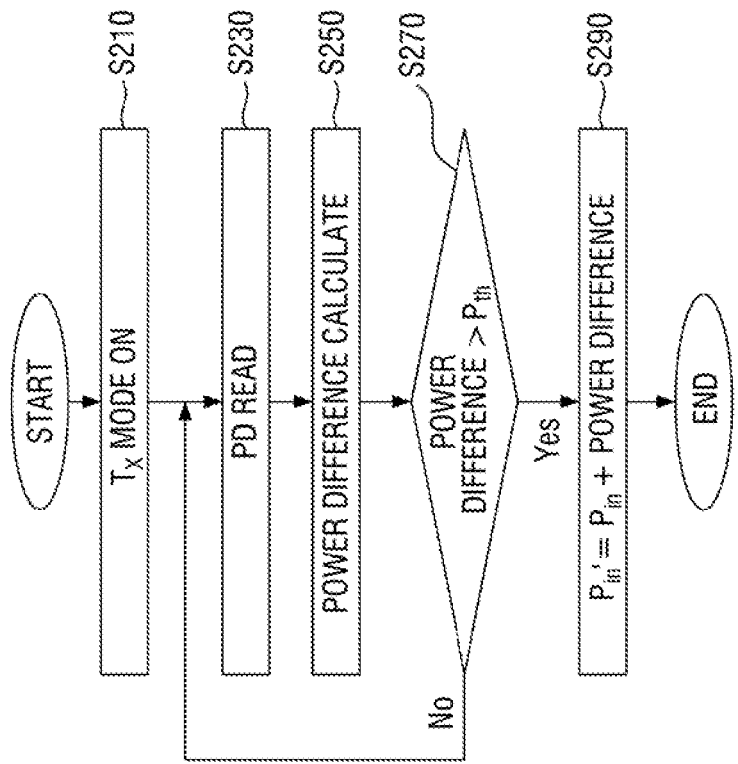
FIG. 11 is a flowchart illustrating an operation of an electronic device according to exemplary embodiments of the present inventive concept.

FIG. 11 is a flowchart illustrating an operation of an electronic device according to exemplary embodiments of the present inventive concept.

Referring to FIGS. 9 and 11, an electronic device according to exemplary embodiments of the present inventive concept may be operated in a transmission mode ($T_X$ mode) (operation S210).

Subsequently, when the transmission mode is executed, the power detector 484 connected to the power amplifier 480 may detect the output power $P_{RF}$ of the RF band signal amplified by the power amplifier 480. The output power $P_{RF}$ detected by the power detector 480 may be provided to the controller 120 of the modem 100. The controller 120 may read the output power $P_{RF}$ (operation S230).

Subsequently, the controller 120 may calculate a difference between the output power $P_{RF}$ and the target power (operation S250). For example, the target power may refer to power of a signal to be outputted to the outside through the antenna module in the electronic device according to exemplary embodiments of the present inventive concept.

The controller 120 may determine whether a difference between the output power $P_{RF}$ and the target power is greater than the power set value $P_{th}$ (operation S270). The power set value $P_{th}$ may be set differently according to the electronic device. The power set value $P_{th}$ may be a predetermined threshold. The power set value $P_{th}$ may be, for example, 0.5 dB, but is not limited thereto.

If it is determined that the difference between the output power $P_{RF}$ and the target power is greater than the power set value $P_{th}$, the controller 120 may increase the input power $P_{in}$ inputted to the RF transceiver 400 (operation S290). For example, the controller 120 may input the input power $P_{in}'$ obtained by adding the difference between the output power $P_{RF}$ and the target power to the input power $P_{in}$ inputted to the RF transceiver 400.

The controller 120 may increase, for example, the power $P_{BB}$ of the baseband signal BB to increase the input power $P_{in}$ inputted to the RF transceiver 400. Alternatively, the controller 120 may increase, for example, the input power $P_{IF}$ of the IF band signal IF inputted to the RF transceiver 400.

Figure 12:
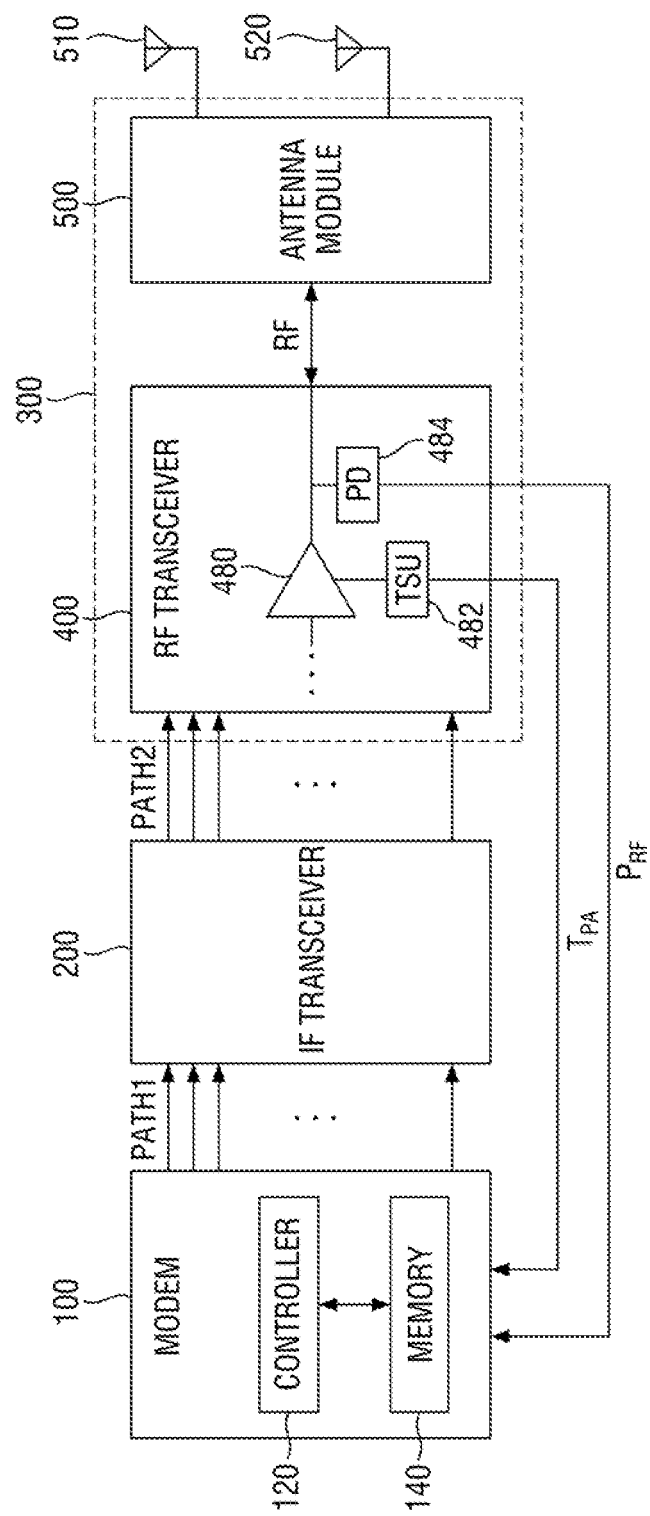
FIG. 12 is a block diagram of an electronic device according to other exemplary embodiments of the present inventive concept.

FIG. 12 is a block diagram of an electronic device according to other exemplary embodiments of the present inventive concept.

Referring to FIG. 12, at least one first path PATH1 may be formed between the modem 100 and the IF transceiver 200. At least one second path PATH2 may be formed between the IF transceiver 200 and the RF transceiver 400. The at least one first path PATH1 and/or second path PATH2 may include paths with different path losses, for example 5 dB, 7 dB, and the like. For example, the at least one first path PATH1 may include a path with a 5 dB loss and another path with a 7 dB loss.

The controller 120 may select one of at least one first path PATH1 and/or at least one second path PATH2 based on the output power $P_{RF}$ of the amplified RF signal detected by the power detector 484. Hereinafter, this process will be described with reference to FIG. 13.

Figure 13:
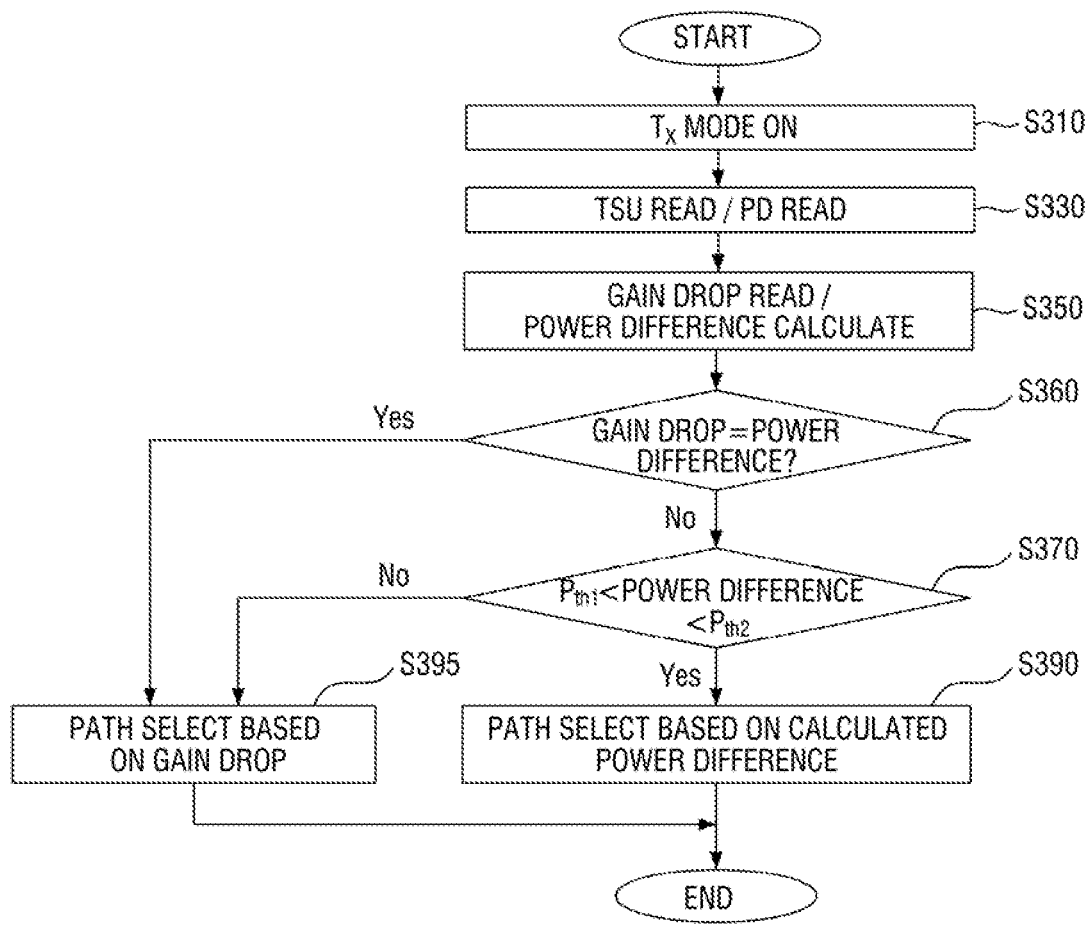
FIG. 13 is a flowchart illustrating an operation of an electronic device according to other exemplary embodiments of the present inventive concept.

FIG. 13 is a flowchart illustrating an operation of an electronic device according to other exemplary embodiments of the present inventive concept.

Referring to FIGS. 12 and 13, an electronic device according to exemplary embodiments of the present inventive concept may be operated in a transmission mode ($T_X$ mode) (operation S310).

When the transmission mode is executed, the controller 120 may read the temperature $T_{PA}$ of the power amplifier 480 detected from the temperature sensor unit 482 and the output power $P_{RF}$ of the amplified RF signal detected from the power detector 484 (operation S330). Subsequently, the controller 120 may read the gain drop of the RF transceiver 400 corresponding to the temperature $T_{PA}$ of the power amplifier 480 from the look-up table stored in the memory 140 and calculate the difference between the output power $P_{RF}$ and the target power (operation S350). For example, the target power may refer to power of a signal to be outputted to the outside through the antenna module in the electronic device according to exemplary embodiments of the present inventive concept.

Subsequently, the controller 120 may determine whether the difference between the output power $P_{RF}$ and the target power is the same as the gain drop of the RF transceiver 400 (operation S360).

Subsequently, if it is determined that the difference between the gain drop of the RF transceiver 400 is not the same as the difference between the output power $P_{RF}$ and the target power, the controller 120 may determine whether the difference between the output power $P_{RF}$ and the target power is within a range of second power set values $P_{th1}$ and $P_{th2}$ based on the gain drop of the RF transceiver 400 (operation S370). Referring to FIG. 7, for example, the second power set values $P_{th1}$ and $P_{th2}$ may refer to values obtained by adding or subtracting an increase of the gain drop of the RF transceiver 400 in the look-up table to or from the gain drop of the RF transceiver 400. In other words, when the gain drop of the RF transceiver 400 is 1 dB, the second power set value $P_{th1}$ which is a lower limit may be 0.5 dB obtained by subtracting 0.5 dB from 1 dB, and the second power set value $P_{th2}$ which is an upper limit may be 1.5 dB obtained by adding 0.5 dB to 1 dB.

Then, if it is determined that the difference between the output power $P_{RF}$ and the target power is within the range of the second power set values $P_{th1}$ and $P_{th2}$ based on the gain drop of the RF transceiver 400, based on the difference between the output power $P_{RF}$ and the target power calculated in operation S350, the controller 120 may select one of the at least one first path PATH1 and/or one of the at least one second path PATH2 (operation S390).

On the other hand, in operation S360, if it is determined that the gain drop of the RF transceiver 400 is the same as the difference between the output power $P_{RF}$ and the target power, the controller 120 may select one of the at least one first path PATH1 and/or one of the at least one second path PATH2 based on the gain drop of the RF transceiver 400 (operation S395).

Further, in operation S370, if it is determined that the difference between the output power $P_{RF}$ and the target power is not within the range of the second power set values $P_{th1}$ and $P_{th2}$ based on the gain drop of the RF transceiver 400, the controller 120 may select one of the at least one first path PATH1 and/or one of the at least one second path PATH2 based on the gain drop of the RF transceiver 400 (operation S395).

Therefore, the electronic device according to exemplary embodiments of the present inventive concept may select the first path PATH1 or the second path PATH2 according to a strong electric field or a weak electric field. In addition, the electronic device may select the first path PATH1 or the second path PATH2 according to whether the electronic device affects a human body.

The electronic device according to exemplary embodiments of the present inventive concept shown and described with reference to FIGS. 12 and 13 detects the temperature $T_{PA}$ of the power amplifier 480 from the temperature sensor unit 482, detects the output power $P_{RF}$ of the amplified RF signal from the power detector 484, and selects the first path PATH1 or the second path PATH2 based thereon, but the present inventive concept is not limited thereto. For example, the electronic device according to exemplary embodiments of the present inventive concept may detect the temperature $T_{PA}$ of the power amplifier 480 from the temperature sensor unit 482 and select the first path PATH1 or the second path PATH2 based thereon. Alternatively, the electronic device according to exemplary embodiments of the present inventive concept may detect the output power $P_{RF}$ of the amplified RF signal from the power detector 484 and select the first path PATH1 or the second path PATH2 based thereon.

Figure 14:
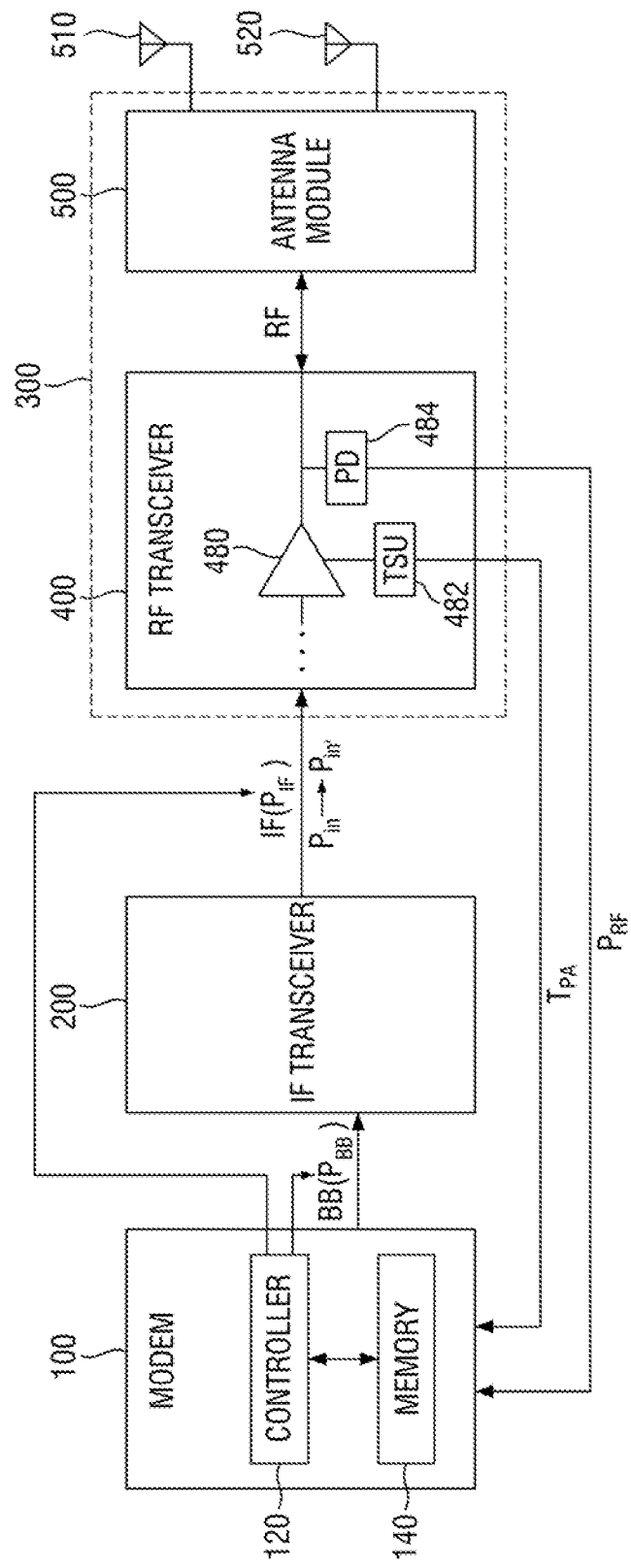
FIG. 14 is a block diagram of an electronic device according to other exemplary embodiments of the present inventive concept.

FIG. 14 is a block diagram of an electronic device according to other exemplary embodiments of the present inventive concept.

Figure 15:
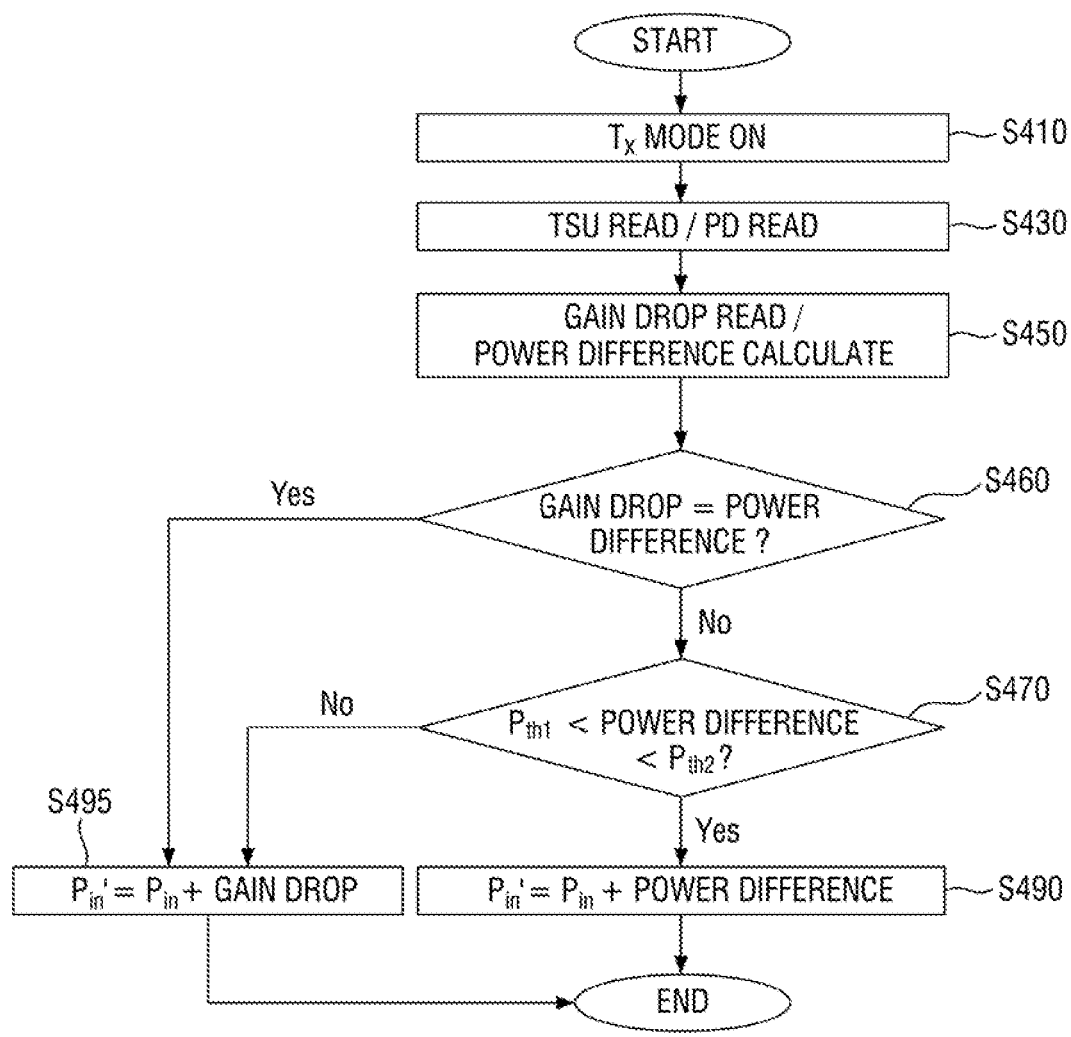
FIG. 15 is a flowchart illustrating an operation of an electronic device according to exemplary embodiments of the present inventive concept.

Referring to FIG. 14, the RF transceiver 400 may include the power amplifier 480, the temperature sensor unit 482 and the power detector 484. FIG. 15 is a flowchart illustrating an operation of an electronic device according to exemplary embodiments of the present inventive concept.

Referring to FIGS. 14 and 15, an electronic device according to exemplary embodiments of the present inventive concept may be operated in a transmission mode ($T_X$ mode) (operation S410).

When the transmission mode is executed, the controller 120 may receive the temperature $T_{PA}$ of the power amplifier 480 from the temperature sensor unit 482 and the output power $P_{RF}$ of the amplified RF band signal from the power detector 484 (operation S430).

Subsequently, the controller 120 may read the gain drop of the RF transceiver 400 corresponding to the temperature $T_{PA}$ of the power amplifier 480 from the look-up table stored in the memory 140 and calculate the difference between the output power $P_{RF}$ and the target power (operation S450).

Subsequently, the controller 120 may determine whether the difference between the output power $P_{RF}$ and the target power is the same as the gain drop of the RF transceiver 400 (operation S460). In other words, the controller 120 determines if the power difference equal to the gain drop.

Subsequently, if it is determined that the difference between the gain drop of the RF transceiver 400 is not the same as the difference between the output power $P_{RF}$ and the target power, the controller 120 may determine whether the difference between the output power $P_{RF}$ and the target power is within the range of the second power set values $P_{th1}$ and $P_{th2}$ based on the gain drop of the RF transceiver 400 (operation S470).

Then, if it is determined that the difference between the output power $P_{RF}$ and the target power is within the range of the second power set values $P_{th1}$ and $P_{th2}$ based on the gain drop of the RF transceiver 400, the controller 120 may input the input power $P_{in}'$ obtained by adding the difference between the output power $P_{RF}$ and the target power to the input power $P_{in}$ inputted to the RF transceiver 400 (operation S490).

As described above, referring to FIG. 7, for example, the second power set values $P_{th1}$ and $P_{th2}$ may refer to values obtained by adding or subtracting an increase of the gain drop of the RF transceiver 400 in the look-up table to or from the gain drop of the RF transceiver 400. In this case, for example, assuming that the difference between the output power $P_{RF}$ and the target power is 1.2 dB, since the difference between the output power $P_{RF}$ and the target power is between 1 dB and 1.5 dB, the controller 120 may input the input power $P_{in}'$ obtained by adding the difference between the output power $P_{RF}$ and the target power to the input power $P_{in}$ inputted to the RF transceiver 400.

On the other hand, in operation S460, if it is determined that the gain drop of the RF transceiver 400 is the same as the difference between the output power $P_{RF}$ and the target power, the controller 120 may input the input power $P_{in}'$ obtained by adding the gain drop of the RF transceiver 400 to the input power $P_{in}$ inputted to the RF transceiver 400 (operation S495).

Further, in operation S470, if it is determined that the difference between the output power $P_{RF}$ and the target power is not within the range of the second power set values $P_{th1}$ and $P_{th2}$ based on the gain drop of the RF transceiver 400, the controller 120 may input the input power $P_{in}'$ obtained by adding the gain drop of the RF transceiver 400 to the input power $P_{in}$ inputted to the RF transceiver 400 (operation S495). Referring to FIG. 10, the output power $P_{RF}$ detected by the power detector 484 may have a variation based on the actual output power $P_{OUT}$. Therefore, if the output power $P_{RF}$ detected by the power detector 484 is not within the range of the second power set values $P_{th1}$ and $P_{th2}$ based on the gain drop of the RF transceiver 400, it may be determined as an error caused by the variation. In other words, the input power $P_{in}$ may be controlled according to the temperature measured by the temperature sensor unit 482.

Figure 16:
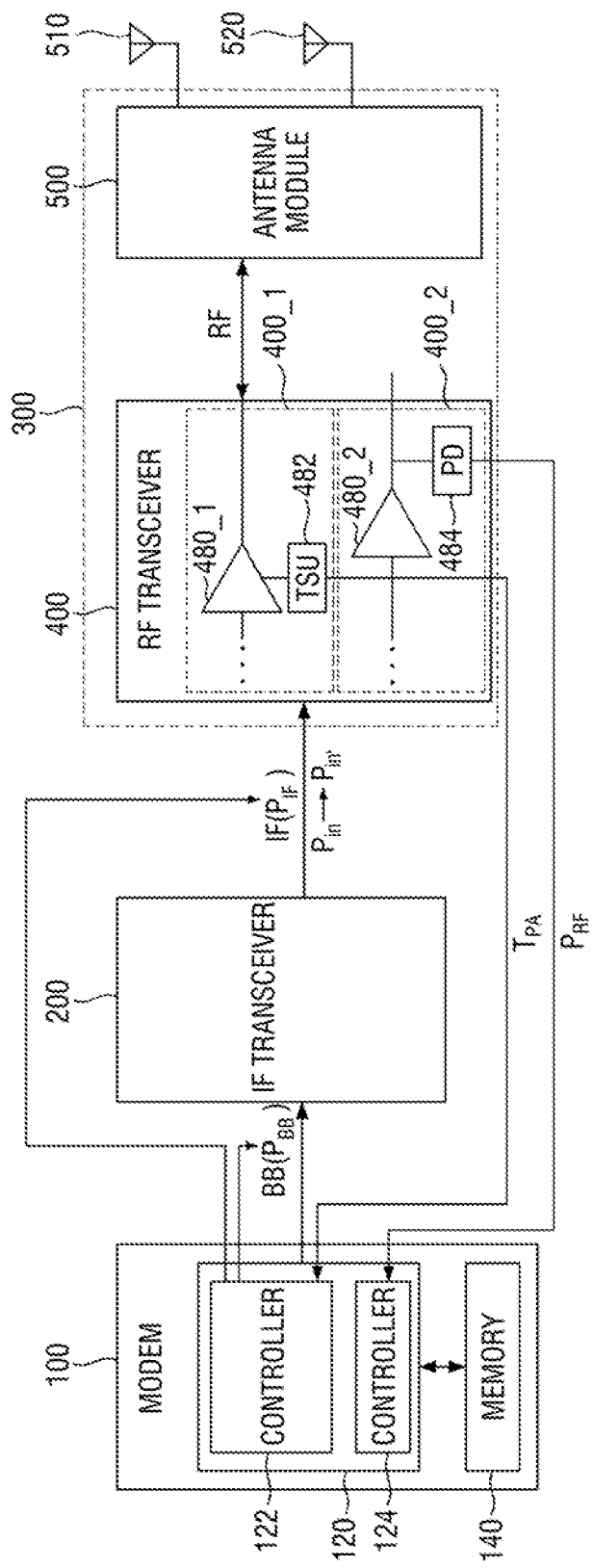
FIG. 16 is a block diagram of an electronic device according to other exemplary embodiments of the present inventive concept.

FIG. 16 is a block diagram of an electronic device according to other exemplary embodiments of the present inventive concept.

Referring to FIG. 16, the RF transceiver 400 may include a first RF transceiver 400_1 and a second RF transceiver 400_2.

The first RF transceiver 400_1 may include a first power amplifier 480_1 and a temperature sensor unit 482 connected to the first power amplifier 480_1.

The second RF transceiver 400_2 may include a second power amplifier 480_2 and a power detector 484 connected to an output terminal of the second power amplifier 480_2.

The controller 120 may include a first controller 122 and a second controller 124.

The first controller 122 may control the input power $P_{in}$ provided to the first RF transceiver 400_1 based on the temperature $T_{PA}$ of the first power amplifier 480_1 measured by the temperature sensor unit 482. The first controller 122 controls the input power $P_{in}$ provided to the first RF transceiver 400_1 in the same manner as the controller 120 illustrated in FIGS. 4 and 8, and thus, a detailed description thereof will be omitted.

The second control unit 124 may control the input power $P_{in}$ provided to the second RF transceiver 400_2 based on the output power $P_{RF}$ of the amplified RF band signal of the second power amplifier 480_2 measured by the power detector 484. The second controller 124 controls the input power $P_{in}$ provided to the second RF transceiver 400_2 in the same manner as the controller 120 illustrated in FIGS. 9 and 11, and thus, a detailed description thereof will be omitted.

Although FIG. 16 shows first and second controllers 122 and 124, and first and second power amplifiers 480_1 and 480_2, more than two controllers and more than two power amplifiers may be provided in the electronic device. Furthermore, a single controller may be employed to control the input power $P_{in}$ provided to the first and second RF transceivers 400_1 and 400_2. Moreover, the first and second power amplifiers 480_1 and 4802 may be configured to include just power detectors and just temperature sensor units.

Figure 17A:
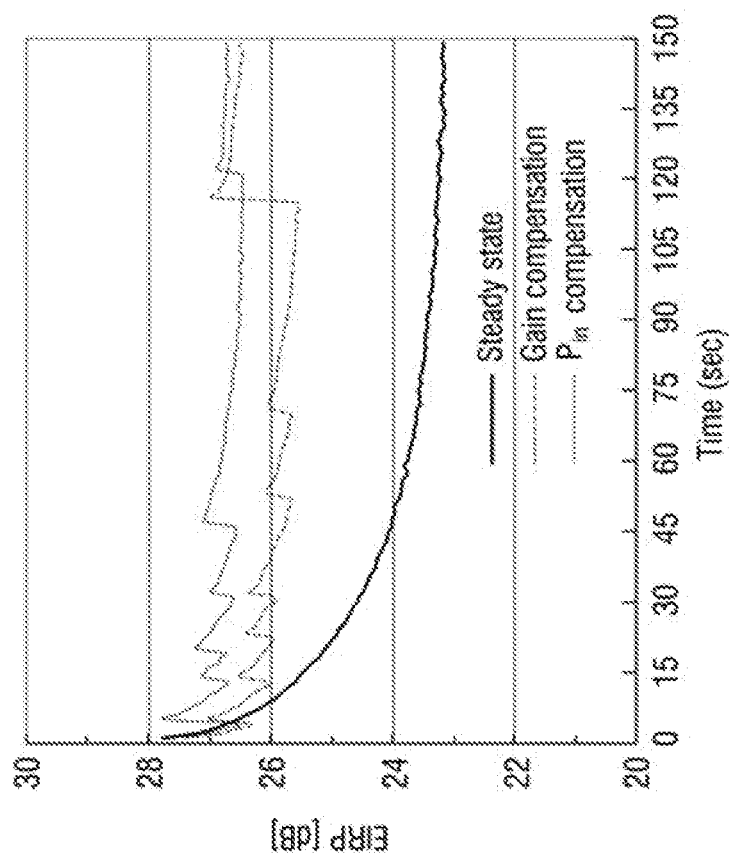
FIG. 17A is a graph illustrating effective isotropic radiated power (EIRP) of an electronic device according to exemplary embodiments of the present inventive concept.
Figure 17B:
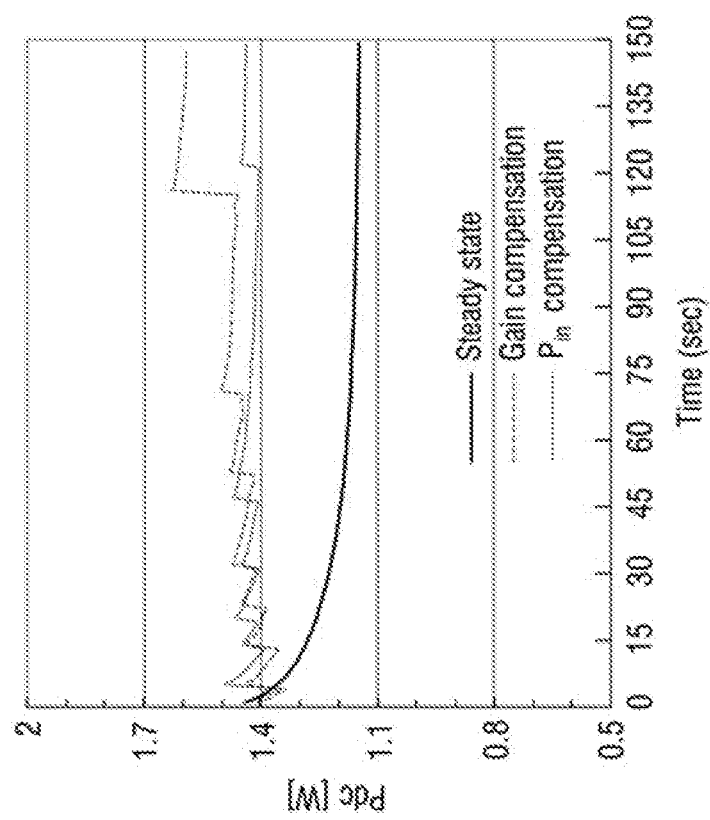
FIG. 17B is a graph illustrating an output power $P_{dc}$ of an electronic device according to exemplary embodiments of the present inventive concept.

FIG. 17A is a graph illustrating effective isotropic radiated power (EIRP) of an electronic device according to exemplary embodiments of the present inventive concept. FIG. 17B is a graph illustrating an output power $P_{dc}$ of an electronic device according to exemplary embodiments of the present inventive concept.

Referring to FIGS. 17A and 17B, the graphs represent a steady state where there is no power compensation for the output power of the electronic device, a state (Gain compensation) where power compensation is made for the output power of the electronic device through a bias of the power amplifier, and a state ($P_{in}$ compensation) where power compensation is made for the output power of the electronic device through the input power inputted to the RF transceiver according to exemplary embodiments of the present inventive concept.

In a state (Steady state) where there is no power compensation, the effective isotropic radiated power (EIRP) of the electronic device and the output power $P_{dc}$ of the electronic device may decrease over time.

In the state (Gain compensation) where power compensation is made for the output power of the electronic device through a bias of the power amplifier, since this state increases the bias of the power amplifier, a large amount of current can be consumed. In other words, additional current is used. Thus, the electronic device consumes more power, which may cause more heat to be generated by the electronic device.

In the state ($P_{in}$ compensation) where power compensation is made for the output power of the electronic device through the input power inputted to the RF transceiver, the effective isotropic radiated power (EIRP) of the electronic device and the output power $P_{dc}$ of the electronic device may have values similar to the target effective isotropic radiated power (EIRP at 0 sec) and the target output power ($P_{dc}$ at 0 sec), respectively. Accordingly, an electronic device according to exemplary embodiments of the present inventive concept may match a change in output power through the input power inputted to the RF transceiver. In addition, since the electronic device according to exemplary embodiments of the present inventive concept consumes relatively less power than a state of increasing the bias of the power amplifier, energy efficiency may be improved or enhanced.

Therefore, exemplary embodiments of the present inventive concept provide an electronic device that controls the input power of an RF transceiver to compensate for the output power of the RF transceiver. In addition, exemplary embodiments of the present inventive concept provide an electronic device that controls the input power of an RF transceiver to reduce the power consumption of the RF transceiver while maintaining the output power of the RF transceiver.

While the present inventive concept has been described with reference to exemplary embodiments thereof, it will be understood by those of ordinary skill in the art that various changes in form and details may be made thereto without departing from the spirit and scope of the present inventive concept as set forth by the following claims.

What is claimed is:

1. An electronic device, comprising:
   a modem configured to process a baseband signal;
   an intermediate frequency (IF) transceiver configured to convert the baseband signal provided from the modem into an IF band signal; and
   a radio frequency (RF) transceiver configured to convert the IF band signal provided from the IF transceiver into an RF band signal,
   wherein the RF transceiver includes a power amplifier configured to amplify the RF band signal, and a temperature sensor unit to detect a temperature of the power amplifier,
   wherein the modem includes a controller configured to control an input power inputted to the RF transceiver based on the temperature of the power amplifier detected by the temperature sensor unit,
   wherein the power amplifier includes first and second power amplifiers,
   wherein the temperature sensor unit is connected to the first power amplifier to detect a first temperature of the first power amplifier, wherein the RF transceiver further includes a power detector connected to the second power amplifier to detect an output power of the amplified RF band signal, and wherein the controller controls the input power inputted to the RF transceiver based on the first temperature of the first power amplifier detected by the temperature sensor unit, or a result of calculating a power difference between a target power and the output power detected by the power detector.

2. The electronic device of claim 1, wherein the modem further includes a memory which stores a look-up table including the first temperature of the power amplifier and a gain drop of the RE transceiver corresponding to the first temperature of the power amplifier.

3. The electronic device of claim 1, wherein the controller increases a power of the IF band signal when a gain drop of the RF transceiver corresponding to the temperature of the power amplifier detected by the temperature sensor unit is greater than a first set value.

4. The electronic device of claim 1, wherein the controller increases a power of the baseband signal when a gain drop of the RF transceiver corresponding to the temperature of the power amplifier detected by the temperature sensor is greater than a first set value.

5. The electronic device of claim 1, wherein the. RF transceiver further includes a power detector to detect an output power of the amplified RF band signal, and wherein the controller calculates the power difference between the target power and the output power detected by the power detector to control the input power inputted to the RF transceiver.

6. The electronic device of claim 5, wherein the controller determines whether the power difference is within a set value range based on a gain drop of the RF transceiver corresponding to the temperature of the power amplifier detected by the temperature sensor unit.

7. The electronic device of claim 6, wherein the controller controls the input power inputted to the RF transceiver based on the power difference when the power difference is within the set value range.

8. The electronic device of claim 6, wherein the controller controls the input power inputted to the RF transceiver based on the gain drop of the RF transceiver when the power difference is not within the set value range.

9. The electronic device of claim 1, wherein the RF transceiver includes a first RE transceiver including the first power amplifier and a second RF transceiver including the second power amplifier, and wherein the controller includes a first controller configured to control an input power inputted to the first RF transceiver based on the first temperature of the first power amplifier, and a second controller configured to control an input power inputted to the second RF transceiver based on the output power of the amplified RF band signal.

10. An electronic device, comprising:
a modem configured to process a baseband signal;
an intermediate frequency (IF) transceiver configured to convert the baseband signal provided from the modem into an IF band signal; and
a radio frequency (RF) transceiver configured to convert the IF band signal provided from the IF transceiver into an RF band signal, wherein the RF transceiver includes a power amplifier configured to amplify the RF band signal, and a power detector to detect an output power of the amplified RF band signal, wherein the modem includes a controller configured to control an input power inputted to the RF transceiver based on the output power of the RF band signal detected by the power detector, wherein a plurality of paths is provided between the modem and the IF transceiver, and wherein the controller calculates a difference between a target power and the output power of the RE band si nal detected by the power detector, and selects one of the paths based on the difference between the target power and the output power.

11. The electronic device of claim 10, wherein the controller calculates the difference between the target power and the output power of the RE band signal detected by the power detector, and when the difference between the target power and the output power is greater than a set value, the controller increases the input power inputted to the RF transceiver by the difference between the target power and the output power.

12. The electronic device of claim 10, wherein the controller calculates the difference between the target power and the output power of the RF band signal detected by the power detector, and.

when the difference between the target power and the output power is greater than a set value, the controller increases a power of the baseband signal.

13. The electronic device of claim 10, wherein the RF transceiver includes a temperature sensor unit connected to the power amplifier to detect a temperature of the power amplifier, and wherein the controller selects one of the paths based on the temperature of the power amplifier detected by the temperature sensor unit, or the output power of the RF band signal detected by the power detector.

14. The electronic device of claim 10, wherein a plurality of paths is provided between the IF transceiver and the RF transceiver, and wherein the controller calculates the difference between the target power and the output power of the RF band signal detected by the power detector, and selects one of the paths based on the difference between the target power and the output power.

15. The electronic device of claim 14, wherein the RF transceiver includes a temperature sensor unit connected to the power amplifier to detect a temperature of the power amplifier, and wherein the controller selects one of the paths based on the temperature of the power amplifier detected by the temperature sensor unit, or the output power of the RF band signal detected by the power detector.

16. The electronic device of claim 10, wherein the RF transceiver includes a temperature sensor unit connected to the power amplifier to detect a temperature of the power amplifier, wherein the modem further includes a memory which stores a look-up table including power amplifier temperatures and gain drops of the RF transceiver respectively corresponding to the power amplifier temperatures, and wherein the controller receives the temperature of the power amplifier detected by the temperature sensor unit and the gain drop of the RF transceiver corresponding to the temperature of the power amplifier detected by the temperature sensor unit from the look-up table, and controls the input power inputted to the RF transceiver according to the received gain drop.

17. An electronic device, comprising:

a modem configured to process a baseband signal;

an intermediate frequency (IF) transceiver configured to up-convert the baseband signal outputted from the modem and output an IF band signal; and a radio frequency (RF) transceiver configured to up-convert the IF band signal outputted from the IF transceiver and output an RF hand signal, wherein the RF transceiver includes a power amplifier configured to amplify the RF band signal, a temperature sensor unit connected to the power amplifier to detect a temperature of the power amplifier, and a power detector connected to the power amplifier to detect an output power of the amplified RF band signal, and wherein the modem includes a controller configured to control an input power inputted to the RF transceiver based on the temperature of the power amplifier detected by the temperature sensor unit, or the output power detected by the power detector, and a memory which stores a look-up table including temperatures of the power amplifier and gain drops of the RF transceiver respectively corresponding to the temperatures of the power amplifier, wherein a first path is provided between the modem and the IF transceiver, wherein a second path is provided between the IF transceiver and the RF transceiver, and wherein the controller selects the first path or the second path based on the output power detected by the power detector.

* * * * *